United States Patent
Schwartzkopf

(10) Patent No.: US 6,899,818 B2
(45) Date of Patent: May 31, 2005

(54) METHOD AND COMPOSITION FOR REMOVING SODIUM-CONTAINING MATERIAL FROM MICROCIRCUIT SUBSTRATES

(75) Inventor: George Schwartzkopf, Washington, NJ (US)

(73) Assignee: Mallinckrodt Inc., St. Louis, MO (US)

( * ) Notice: Subject to any disclaimer, the term of this patent is extended or adjusted under 35 U.S.C. 154(b) by 226 days.

(21) Appl. No.: 10/220,720

(22) PCT Filed: Mar. 19, 2001

(86) PCT No.: PCT/US01/08772

§ 371 (c)(1),
(2), (4) Date: Sep. 4, 2002

(87) PCT Pub. No.: WO01/71429

PCT Pub. Date: Sep. 27, 2001

(65) Prior Publication Data

US 2003/0071010 A1 Apr. 17, 2003

Related U.S. Application Data

(60) Provisional application No. 60/190,071, filed on Mar. 20, 2000.

(51) Int. Cl.$^7$ .............................................. C03C 15/00

(52) U.S. Cl. ........................... 216/83; 216/91; 216/106; 252/79.1; 252/79.4

(58) Field of Search ........................... 216/83, 91, 106; 252/79.1, 79.4

(56) References Cited

U.S. PATENT DOCUMENTS 6,465,403 B1 * 10/2002 Skee .......................... 510/175

OTHER PUBLICATIONS

Park, John L, 1998; Ka: The acid Ionization constant (http://dbhs.wvusd.k12.ca.us/webdocs/AcidBase/Ka-Intro.html).*

Topic 19–Acids and bases (http://homepage.mac.com/stray/ib/chem/AHL/topic19.html).*

* cited by examiner

*Primary Examiner*—Duy-Vu N. Deo
*Assistant Examiner*—Binh X. Tran
(74) *Attorney, Agent, or Firm*—George W. Rauchfuss, Jr.; Christine M. Rebman

(57) ABSTRACT

A method and composition for removing sodium-containing materials such as photoresist from microcircuit substrate material utilizes 1,2-Diaminocyclohexanetetracarboxylic Acid in an organic solvent.

14 Claims, No Drawings

METHOD AND COMPOSITION FOR REMOVING SODIUM-CONTAINING MATERIAL FROM MICROCIRCUIT SUBSTRATES

This application claims the benefit of Provisional Application No. 60/190,071, filed on Mar. 20, 2000.

BACKGROUND OF THE INVENTION

1. Field of the Invention

The present invention is in the field of removing photoresist and other materials from microcircuit substrates in the manufacture of integrated circuits.

2. Description of Background Art

An integral part of microelectronic fabrication is the use of photoresists to transfer an image from a mask or reticle to the desired circuit layer. After the desired image transfer has been achieved, the photoresist is removed by stripping before proceeding to some subsequent process step.

Contamination by mobile ions, especially by sodium ions, is responsible for many failures of integrated circuits, especially during high temperature operation bias burn-in tests. Mobile ion contamination may be introduced at various stages during integrated circuit fabrication.

Those concerned with the development of integrated circuit technology have continuously sought for materials and techniques to reduce mobile ion contamination. In U.S. Pat. No. 5,417,802, crown ethers were used to sequester Group I and Group II ions in organic solvents used for photoresist removal.

SUMMARY OF THE INVENTION

In accordance with the present invention, a method and composition are provided for stripping sodium-containing material, such as photoresist. The stripping composition comprises 1,2-Diaminocyclohexanetetracarboxylic Acid (CYDTA) in an organic solvent. The method of the invention comprises contacting said substrate with said stripping composition.

DETAILED DESCRIPTION OF THE INVENTION

The organic solvents used in photoresist removal and post-metal etch cleaning are a common source of mobile ion contamination. Typical solvents include blends of primary and secondary amines and other inert solvents such as dimethylsulfoxide and dimethylacetamide. These solvents are usually stored in plastic (for example, high density polypropylene) containers. The manufacture of these plastic containers involves the use of inorganic catalysts, which may contain sodium. Consequently, when the solvents are stored in these plastic containers, sodium can leach into the solvent. The concentration of sodium in the solvent increases with the duration of contact with the plastic.

It has been discovered that 1,2-Diaminocyclohexanetetracarboxylic Acid (CYDTA), which coordinates well with sodium ions, inhibits the adsorption of sodium to integrated circuit surfaces. The addition of 1,2-Diaminocyclohexanetetracarboxylic Acid to organic solvents conventionally used in either photoresist removal or post-metal etch clean-up has been found to significantly reduce the concentration of sodium found on the surface of the resulting cleaned integrated circuits.

Experiments using titanium nitride deposited on silicon substrates and inspected with secondary ion mass spectroscopy (SIMS) indicate that the addition of 1,2-Diaminocyclohexanetetracarboxylic Acid to such conventional organic solvent formulations as ALEG-310®, a registered trademark of Mallinckrodt Baker Incorporated of Phillipsburg, N.J., significantly reduced the surface sodium concentrations of these substrates. Direct comparison to parallel treatments with the previously disclosed crown ethers showed that the present invention resulted in much lower sodium concentrations on the resulting cleaned surfaces.

In a typical application, a patterned photoresist may be removed from etched oxide, metal or semiconductor substrate features using an organic solvent modified by the addition of 1,2-Diaminocyclohexanetetracarboxylic Acid, thereby reducing the extent of sodium contamination of the resulting integrated circuit. Alternatively, the photoresist may be partially removed by exposure to an oxygen plasma and the resulting unwanted residues further removed using the present invention.

One embodiment utilizes a stripping solvent, a nucleophilic amine, a non-nitrogen containing weak acid in an amount sufficient to partially the nucleophilic amine such that the stripping composition has an aqueous pH, when diluted with about 10 parts of water, of about 9.6 to about 10.9, said weak acid having a value in aqueous solution of 2.0 or greater and an equivalent weight of less than 140, and 1,2-Diaminocyclohexanetetracarboxylic Acid, whereby said stripping composition is able to strip unwanted photoresist or photoresist residues with minimal increases in the surface sodium concentration of the cleaned integrated circuit.

The non-nitrogen containing weak acids that may be employed in this invention include organics such as carboxylic acids or phenols as well as salts of inorganic acids such as carbonic or hydrofluoric acid.

By weak acids is meant acids having a strength expressed as a "pKa" for the dissociation constant in aqueous solution of at least 2.0 or higher, preferably 2.5 or higher. Particularly useful are weak acids of pKa>2.0 and preferably having an equivalent weight of less than about 140. As examples of such non-nitrogen containing weak acids useful in this invention there may be mentioned, for example, carboxylic acids such as acetic acid, phthalic acid, phenoxyacetic acid and the like, organic acids such as 2-mercaptobenzoic acid, 2-mercaptoethanol and the like, phenols generally having pKa in the range of from 9 to 10, such as phenol, 1,3,5-trihydroxybenzene, pyrogallol, resorcinol, 4-tert-butylcatechol and the like, and inorganic acids such as carbonic acid, hydrofluoric acid and the like. The amount of weak acid employed in the stripping compositions of this invention is from about 005% to about 25% by weight of said composition and is present in an amount to neutralize about 19% to about 75% by weight of the amine present in the stripper composition thereby resulting in an aqueous rinse pH for said stripper compositions of from about pH 9.6 to about 10.9.

Alkaline stripper components that may be used in this invention also cover a wide range of structural types. Their dissociation constants, once again expressed as pKa values, range from about 9 to 11 for the beta-oxygen or -nitrogen substituted amines to 8.3 for the secondary amine, morpholine and hydroxylamines and hydroxylamine derivatives of somewhat lower pKa values. Among the alkaline components that may be used there may be mentioned, nucleophilic amines, preferably for example, 1-amino-2-propanol, 2-(2-aminoethoxy)ethanol, 2-aminoethanol, 2-(2-aminoethylamino)ethanol, 2-(2-aminoethylamino)

ethylamine and the like. More important than the actual pKa value of an amine is its nucleophilicity which should be high. The amount of amine component employed in the stripping compositions of this invention is from about 1% to about 50% by weight of said composition.

It is believed that the interaction of these alkaline stripper components with the range of weak acids used in this invention is essentially reversible:

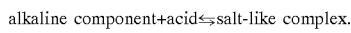
alkaline component+acid⇌salt-like complex.

Because of the reversibility of this reaction, substantial concentrations of the alkaline component would remain available during the stripping process even though much of the alkaline component has been neutralized from a stoichiometric point of view. This would account for the surprisingly rapid stripping rates that are observed even in the presence of these acids.

The photoresist stripping compositions of this invention comprise an organic solvent system. The organic solvent system is one having a solubility parameter of from about 8 to about 15, obtained by taking the square root of the sum of the squares of the three Hansen solubility parameters (dispersive, polar and hydrogen bonding). The solvent system may comprise any of a number of individual solvents or a mixture of several different solvents. As example of such solvents there may be mentioned, various pyrrolidinone compounds such as 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, 1-hydroxypropyl-2-pyrrolidinone, and the like, diethylene glycol monoalkyl ethers such as those of the formula HOCH$_2$CH$_2$—O—CH$_2$CH$_2$—O—R where R is an alkyl radical of from 1 to 4 carbon atoms, compounds containing sulfur oxides such as dialkyl sulfones of the formula

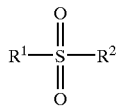

where R$^1$ and R$^2$ are alkyl of 1 to 4 carbon atoms, dimethyl sulfoxide (DMSO), tetrahydrothiophene-1,1-dioxide compounds of the formula

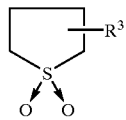

wherein R$^3$ is hydrogen, methyl or ethyl, such as sulfolane, methyl sulfolane and ethyl sulfolane, as well as polyethylene glycols, dimethylacetamide or dimethylformamide. The solvent system portion of the stripper compositions of this invention will generally comprise from about 50% to about 98% by weight of the composition, preferably about 85% to about 98% by weight.

Preferred solvents are N-alkyl-2-pyrrolidinones, such as N-methyl, N-ethyl-, N-propyl-, and N-(2-hydroxyethyl)-, Dimethylsulfoxide, Dimethylacetamide and Dimethylformamide.

Particularly preferred solvents are N-methyl-2-pyrrolidinone and tetrahydrothiophene-1,1-dioxide.

EXAMPLE

One thousand grams of a stripper solvent containing about 50 parts of N-methyl-2-pyrrolidinone, about 10 parts of tetrahydrothiophene-1,1-dioxide, about 25 parts of 2-aminoethanol, about 5 parts of 1,2-dihydroxybenzene, and about 10 parts of water were weighed into a fluoropolymer beaker. The additives, 1,2-Diaminocyclohexanetetracarboxylic Acid or 18-Crown-6, were weighed out and dissolved in the stripper solvent as needed. The solution was then raised to the desired temperature and a titanium nitride (TiN) coated wafer was placed in the solution for twenty minutes, removed and rinsed with DI water and analyzed using SIMS. All experiments were carried out in a class 100 clean room taking extra care to prevent sodium contamination of the wafer.

Three wafers were subjected to the water rinsing and drying step only to establish a baseline sodium value without any stripper solvent treatment. The unmodified stripper solvent was tested at 65C and 85C for twenty minutes to determine the relative sodium levels left behind on the TiN surface by this process. Results are shown in Table 1. For the second set of experiments, 0.1 weight percent of 1,2-Diaminocyclohexanetetracarboxylic Acid Monhydrate (CYDTA) was added to the stripper solvent. For the third set of experiments the weight percent of 1,2-Diaminocyclohexanetetracarboxylic Acid Monhydrate was increased to 0.5%. For the fourth set of experiments the weight percent of 1,2-Diaminocyclohexanetetracarboxylic Acid Monhydrate was increased to 0.9%. In the fifth set, 0.1 weight percent of 18-Crown-6 was added to the stripper solvent and tested at 45C, 65C and 85C.

These data (Table 1) clearly show that the addition of 1,2-Diaminocyclohexanetetracarboxylic Acid to the stripper solvent results in much lower sodium surface concentrations than the unmodified solvent. Crown ether addition had no beneficial effect.

TABLE 1

| Process | Treatment Temperature | Relative Surface Sodium Concentration (using SIMS) |
|---|---|---|
| Water rinse and dry | (untreated) | 0.0052, 0.0046, 0.0051 |
| Stripper solvent only | 65 C. | 0.16 |
|  | 85 C. | 0.25 |
| Solvent + 0.1% CYDTA | 65 C. | 0.04 |
|  | 85 C. | 0.07 |
| Solvent + 0.5% CYDTA | 65 C. | 0.02 |
|  | 85 C. | 0.05 |
| Solvent + 0.9% CYDTA | 65 C. | 0.03 |
|  | 85 C. | 0.04 |
| Solvent + 0.1% 18-Crown-6 | 45 C. | 0.33 |
|  | 65 C. | 0.41 |
|  | 85 C. | 0.45 |

What is claimed is:

1. A method of inhibiting adsorption of sodium-to integrated circuit surfaces during photoresist removal or post-metal etch cleanup with an organic solvent-containing composition, comprising contacting the surface with an organic solvent-containing composition comprising:
   a) 1,2-diaminocyclohexanetetracarboxylic acid (CYDTA),
   b) a nucleophilic amine present in an amount of from about 1 to less than about 50% by weight of the composition,
   c) a non-nitrogen containing weak acid in an amount sufficient to partially neutralize the nucleophilic amine such that the composition has an aqueous pH, when diluted with about 10 parts of water, of about 9.6 to about 10.9, said weak acid having a pKa value in aqueous solution of 2.0 or greater and an equivalent weight of less than 140, and the solvent is a stripping solvent system having a solubility parameter of from about 8 to about 15 and is present in an amount of from about 50% to about 85% by weight of the composition.

2. The method of claim 1 comprising, on a weight basis, from about 50% to about 85% of N-methyl-2-pyrrolidinone as solvent, from about 1 to about 20% of tetrahydrothiophene-1,1-dioxide as solvent, from about 1 to about 20% of water, from about 1 to about 50% of 2-aminoethanol as the nucleophilic amine, from about 0.05% to about 25% of 1,2-dihydroxybenzene as the non-nitrogen containing weak acid and about 0.01% to 5% of 1,2-diaminocyclohexanetetracarboxylic acid.

3. The method of claim 1, wherein the non-nitrogen containing weak acid is present in the composition in an amount of from about 0.05% to about 25% by weight of said stripping composition.

4. The method of claim 3, wherein the non-nitrogen containing weak acid has a pKa of 2.5 or higher.

5. The method of claim 4 wherein the non-nitrogen containing weak acid is 1,2-dihydroxybenzene.

6. The method of claim 5 wherein the nucleophilic amine is 2-aminoethanol.

7. The method of claim 6 wherein the solvent system comprises N-methyl-2-pyrrolidinone and tetrahydrothiophene-1,1-dioxide and optionally up to about 10% water.

8. A composition for inhibiting adsorption of sodium-to integrated circuit surfaces during photoresist removal or post-metal etch cleanup with an organic solvent-containing composition, said organic solvent-containing composition comprising:

a) 1,2-diaminocyclohexanetetracarboxylic acid (CyDTA), b) a nucleophilic amine present in an amount of from about 1 to less than about 50% by weight of the composition, c) a non-nitrogen containing weak acid in an amount sufficient to partially neutralize the nucleophilic amine such that the composition has an aqueous pH, when diluted with a bout 10 p arts of water, of a bout 9.6 to about 10.9, said weak acid having a pKa value in aqueous solution of 2.0 or greater and an equivalent weight of less than 140, and the solvent is a stripping solvent system having a solubility parameter of from about 8 to about 15 and is present in an amount of from about 50% to about 85% by weight of the composition.

9. The composition of claim 8 comprising, on a weight basis, from about 50% to about 85% of N-methyl-2-pyrrolidinone as solvent, from about 1 to about 20% of tetrahydrothiophene-1,1-dioxide as solvent, from about 1 to about 20% of water, from about 1 to about 50% of 2-aminoethanol as the nucleophilic amine, from about 0.05% to about 25% of 1,2-dihydroxybenzene as the non-nitrogen containing weak acid and about 0.01% to 5% of 1,2-diaminocyclohexanetetracarboxylic acid.

10. The composition of claim 8, wherein the non-nitrogen containing weak acid is present in the composition in an amount of from about 0.05% to about 25% by weight of said stripping composition.

11. The composition of claim 10, wherein the non-nitrogen containing weak acid has a pKa of 2.5 or higher.

12. The composition of claim 11 wherein the non-nitrogen containing weak acid is 1,2-dihydroxybenzene.

13. The composition of claim 12 wherein the nucleophilic amine is 2-aminoethanol.

14. The composition of claim 13 wherein the solvent system comprises N-methyl-2-pyrrolidinone and tetrahydrothiophene-1,1-dioxide and optionally up to about 10% water.

* * * * *